(12) United States Patent
Terakawa et al.

(10) Patent No.: US 7,199,395 B2
(45) Date of Patent: Apr. 3, 2007

(54) PHOTOVOLTAIC CELL AND METHOD OF FABRICATING THE SAME

(75) Inventors: Akira Terakawa, Nara (JP); Toshio Asaumi, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 49 days.

(21) Appl. No.: 10/948,265

(22) Filed: Sep. 24, 2004

(65) Prior Publication Data
US 2005/0062041 A1  Mar. 24, 2005

(30) Foreign Application Priority Data
Sep. 24, 2003 (JP) ............... 2003-331284
Sep. 24, 2003 (JP) ............... 2003-332549

(51) Int. Cl.
H01L 29/04 (2006.01)
H01L 31/036 (2006.01)
H01L 31/0376 (2006.01)
H01L 31/20 (2006.01)

(52) U.S. Cl. ............ 257/52; 257/53; 257/461

(58) Field of Classification Search ........... 257/40, 257/52, 53, 428, 431, 433, 437, 459, 461, 257/464
See application file for complete search history.

(56) References Cited

U.S. PATENT DOCUMENTS 4,927,770 A    5/1990   Swanson
5,053,083 A   10/1991   Sinton
5,213,628 A    5/1993   Noguchi et al.
5,705,828 A    1/1998   Noguchi et al.
6,927,417 B2 * 8/2005   Nagashima et al. .......... 257/55

FOREIGN PATENT DOCUMENTS

JP  4-130671     5/1992
JP  5-102504     4/1993
JP  11/224954    8/1999
JP  2001-267610  9/2001

OTHER PUBLICATIONS

Sinton, R. A., et al. "27.5-Percent Silicon Concentrator Solar Cells" IEEE Electron Device Letters, vol. EDL-7, No. 10, Oct. 1986, pp. 567-569.

* cited by examiner

*Primary Examiner*—Thien F. Tran
(74) *Attorney, Agent, or Firm*—McDermott Will & Emery LLP

(57) ABSTRACT

An i-type amorphous silicon film and an anti-reflection film made of amorphous silicon nitride or the like are formed in this order on a main surface of an n-type single-crystalline silicon substrate. On a back surface of the n-type single-crystalline silicon substrate are provided a positive electrode and a negative electrode next to each other. The positive electrode includes an i-type amorphous silicon film, a p-type amorphous silicon film, a back electrode, and a collector electrode formed in this order on the back surface of the n-type single-crystalline silicon substrate. The negative electrode includes an i-type amorphous silicon film, an n-type amorphous silicon film, a back electrode, and a collector electrode formed in this order on the back surface of the n-type single-crystalline silicon substrate.

13 Claims, 8 Drawing Sheets

PHOTOVOLTAIC CELL AND METHOD OF FABRICATING THE SAME

BACKGROUND OF THE INVENTION

1. Field of the Invention

The present invention relates to a photovoltaic cell using a semiconductor junction and a method of fabricating the same.

2. Description of the Background Art

In recent years, a photovoltaic cell having a junction of an n-type single-crystalline silicon substrate and a p-type amorphous silicon film has been developed. In order to enhance photoelectric conversion efficiency of such a photovoltaic cell, it is necessary to enhance fill factor F.F. while maintaining high short-circuit current Isc and open-circuit voltage Voc.

At the junction of the n-type single-crystalline substrate and the p-type amorphous silicon film, however, there are multiple interface states, causing recombination of carriers to lower the open-circuit voltage Voc.

For this reason, in order to suppress such recombination of carriers at the junction of an n-type single-crystalline silicon substrate and a p-type amorphous silicon film, a photovoltaic cell of an HIT (Heterojunction with Intrinsic Thin-Layer) structure has been proposed in which a substantially intrinsic amorphous silicon film (i-type amorphous silicon film) is inserted between the n-type single-crystalline silicon substrate and the p-type amorphous silicon film (refer to JP 11-224954 A, for example).

This photovoltaic cell receives light on a main-surface of the n-type single-crystalline silicon substrate, generating power inside the n-type single-crystalline silicon substrate. The power thus generated can be taken out of the cell through the electrodes provided on the main surface and back surface.

In the above photovoltaic cell, however, the electrode and the p-type amorphous silicon film on the main-surface side absorbs light, causing the number of photons incident on the n-type single-crystalline silicon substrate to be decreased, resulting in limited power generation efficiency.

In addition, the above photovoltaic cell comprises a large number of layers, causing its manufacturing processes to be complex and manufacturing cost expensive.

SUMMARY OF THE INVENTION

It is an object of the present invention to provide a photovoltaic cell and a method of fabricating the same which allows for the maximum use of incident light.

It is another object of the present invention to provide a photovoltaic cell and a method of fabricating the same which allows for the maximum use of incident light with reduced manufacturing cost and manufacturing time.

A crystal-based semiconductor as used in the specification covers a single-crystalline semiconductor and a polycrystalline semiconductor, whereas an amorphous-based semiconductor covers an amorphous semiconductor and a microcrystalline semiconductor.

Note also that an intrinsic amorphous-based semiconductor film is an amorphous-based semiconductor film that is not intentionally doped with some impurity, also including an amorphous-based semiconductor film having impurities intrinsically contained in a semiconductor raw material or impurities which may naturally be included during the manufacturing process.

A photovoltaic cell according to one aspect of the present invention comprises: a crystal-based semiconductor having one face and another face; an intrinsic first amorphous-based semiconductor film; a second amorphous-based semiconductor film including impurities showing one conductivity-type; a first electrode; a semiconductor layer including impurities showing another conductivity-type different from the one conductivity-type; and a second electrode, wherein the first amorphous-based semiconductor film, the second amorphous-based semiconductor film, and the first electrode are formed in this order on a first region of the one face of the crystal-based semiconductor, and the semiconductor layer and the second electrode are formed in this order on a second region of the one face of the crystal-based semiconductor.

In the photovoltaic cell, the crystal-based semiconductor receives light from the another-face side, causing holes and electrons to be produced, so that the produced holes are taken out of the cell by either a route passing through the first amorphous-based semiconductor film and second amorphous-based semiconductor film to the first electrode or a route passing through the semiconductor layer to the second electrode, while the produced electrons are taken out by an opposite route to the holes.

In this case, the first electrode and the second electrode are formed on the one-face side, so that reflection and absorption losses of light incident from the another face of the crystal-based semiconductor can be suppressed. This allows for effective use of incident light by receiving light from the another face of the crystal-based semiconductor.

The crystal-based semiconductor may include impurities showing the one conductivity-type. In this case, a p-n junction is formed between the crystal-based semiconductor and the semiconductor film, so that carriers can be efficiently taken out.

The semiconductor layer may be a third amorphous-based semiconductor film including impurities showing the another conductivity-type, the photovoltaic cell further comprising an intrinsic fourth amorphous-based semiconductor film provided between the crystal-based semiconductor and the third amorphous-based semiconductor film.

In this case, recombination of carriers between the crystal-based semiconductor and the third amorphous-based semiconductor film is prevented, leading to enhanced power generation efficiency.

The first amorphous-based semiconductor film on the first region of the crystal-based semiconductor and the fourth amorphous-based semiconductor film on the second region may be a continuous common amorphous-based semiconductor film.

In this case, the one-face side of the crystal-based semiconductor is covered with the intrinsic amorphous-based semiconductor film. This eliminates an exposed portion of the one-face side of the crystal-based semiconductor, which prevents recombination of carriers on the one-face side of the crystal-based semiconductor, leading to enhanced power generation efficiency.

The second amorphous-based semiconductor film and the third amorphous-based semiconductor film may be provided at a distance from each other, the photovoltaic cell further comprising a protective layer provided on a surface of the common amorphous-based semiconductor film between the second amorphous-based semiconductor film and the third amorphous-based semiconductor film.

In this case, an exposed portion between the second and third amorphous-based semiconductor films on the surface of the common amorphous-based semiconductor film is covered with the protective layer. This eliminates the exposed portion on the surface of the common amorphous-based semiconductor film, so that the common amorphous-based semiconductor film can be prevented from damage in the formation of the first and second electrodes.

The first amorphous-based semiconductor film on the first region of the crystal-based semiconductor and the fourth amorphous-based semiconductor film on the second region may be formed in contact with each other.

In this case, the one-face side of the crystal-based semiconductor is covered with the intrinsic amorphous-based semiconductor film. This eliminates an exposed portion on the one-face side of the crystal-based semiconductor, which prevents recombination of carriers on the one-face side of the crystal-based semiconductor, leading to enhanced power generation efficiency.

The second amorphous-based semiconductor film and the third amorphous-based semiconductor film may be formed in contact with each other.

In this case, the one-face side of the crystal-based semiconductor is covered with the intrinsic amorphous-based semiconductor film and second and third amorphous-based semiconductor films. This eliminates completely an exposed portion of the one-face side of the crystal-based semiconductor, which sufficiently prevents recombination of carriers on the one-face side of the crystal-based semiconductor, leading to much enhanced power generation efficiency.

The first region and the second region may be provided at a distance from each other, the photovoltaic cell further comprising a protective layer provided on a surface of the crystal-based semiconductor between the first region and the second region.

In this case, an exposed portion between the first and second regions on the one-face side of the crystal-based semiconductor is covered with the protective layer. This eliminates the exposed portion on the one-face side of the crystal-based semiconductor, which prevents recombination of carriers on the one-face side of the crystal-based semiconductor, leading to enhanced power generation efficiency. In addition, the surface of the common amorphous-based semiconductor film can be prevented from damage in the formation of the first and second electrodes.

The semiconductor layer may be a doped layer in which the second region of the crystal-based semiconductor is doped with impurities showing the another conductivity-type.

In this case, the doped layer provides an electrical contact between the crystal-based semiconductor and the second amorphous-based semiconductor.

The second amorphous-based semiconductor film may be a doped layer in which the first amorphous-based semiconductor film is doped with impurities showing the another conductivity-type.

In this case, the second amorphous-based semiconductor film showing the another conductivity-type can be formed easily.

The photovoltaic cell may further comprise an anti-reflection film provided on the another face of the crystal-based semiconductor.

In this case, incident light can be efficiently transmitted inside the photovoltaic cell, so that more of the incident light can be used.

The photovoltaic cell may further comprise an intrinsic fifth amorphous-based semiconductor film provided between the another face of the crystal-based semiconductor and the anti-reflection film.

In this case, the another-face side of the crystal-based semiconductor is covered with the intrinsic amorphous-based semiconductor film. This prevents recombination of carriers on the another-face side of the crystal-based semiconductor, leading to enhanced power generation efficiency.

Substantially the whole of the another face may be a light-incident surface. In this case, a sufficient amount of light is incident from the another face, leading to the maximum use of the incident light.

A photovoltaic cell according to another aspect of the present invention comprises: a crystal-based semiconductor having one face and another face; an intrinsic first amorphous-based semiconductor film formed on the one face of the crystal-based semiconductor; a second amorphous-based semiconductor film including impurities showing one conductivity-type; a third amorphous-based semiconductor film including impurities showing another conductivity-type different from the one conductivity-type; a first electrode; and a second electrode, wherein the second amorphous-based semiconductor film is formed on a first region of the first amorphous-based semiconductor film, the third amorphous-based semiconductor film is formed on a second region of the first amorphous-based semiconductor film and the second amorphous-based semiconductor film, the first electrode is formed on the third amorphous-based semiconductor film on top of the first region, and the second electrode is formed on the third amorphous-based semiconductor film on top of the second region.

In the photovoltaic cell, a step of coating the second amorphous-based semiconductor film with a mask is eliminated in the formation of the third amorphous-based semiconductor film. This reduces manufacturing cost and manufacturing time.

Moreover, in the photovoltaic cell the crystal-based semiconductor receives light on the another-face side, causing holes and electrons to be produced, so that the produced holes are taken out of the cell by either a route passing through the first amorphous-based semiconductor film, second amorphous-based semiconductor film and third amorphous-based semiconductor film to the first electrode or a route passing through the first amorphous-based semiconductor film and third amorphous-based semiconductor film to the second electrode, while the produced electrons are taken out by an opposite route to the holes. In this case, the first electrode and the second electrode are formed on the one-face side, so that reflection and absorption losses of light via an electrode on another face of the crystal-based semiconductor are prevented. Hence by receiving light from the another face of the crystal-based semiconductor, the maximum use of incident light is realized.

A photovoltaic cell according to still another aspect of the present invention comprises: a crystal-based semiconductor having one face and another face; an intrinsic first amorphous-based semiconductor film; a second amorphous-based semiconductor film including impurities showing one conductivity-type; a first electrode; an intrinsic third amorphous-based semiconductor film; a fourth amorphous-based semiconductor film including impurities showing another conductivity-type different from the one conductivity-type; and a second electrode, wherein the first amorphous-based semiconductor film is formed on a first region of the one face of the crystal-based semiconductor, the second amorphous-based semiconductor film is formed on the first amorphous-based semiconductor film, the first electrode is formed on the second amorphous-based semiconductor film, the third amorphous-based semiconductor film is formed on a second region of the one face of the crystal-based semiconductor and the first electrode, the fourth amorphous-based semiconductor film is formed on the third amorphous-based semiconductor film, and the second electrode is formed on the fourth amorphous-based semiconductor film on top of the second region.

In the photovoltaic cell, a step of coating the first electrode with a mask is eliminated in the formation of the third amorphous-based semiconductor film and the fourth amorphous-based semiconductor film. This results in reduced manufacturing cost and manufacturing time.

Moreover, in the photovoltaic cell according to the present invention, the crystal-based semiconductor receives light on the another-face side, causing holes and electrons to be produced, so that the produced holes are taken out of the cell by either a route passing through the first amorphous-based semiconductor film, second amorphous-based semiconductor film and third amorphous-based semiconductor film to the first electrode or a route passing through the first amorphous-based semiconductor film and third amorphous-based semiconductor film to the second electrode, while the produced electrons are taken out by an opposite route to the holes. In this case, the first electrode and the second electrode are provided on the one-face side, so that reflection and absorption losses of light via an electrode on the another face of the crystal-based semiconductor are prevented. Hence by receiving light from the another face of the crystal-based semiconductor, the maximum use of incident light is realized.

A method of fabricating a photovoltaic cell according to another aspect of the present invention comprises the steps of: forming an intrinsic first amorphous-based semiconductor film on a first region of one face of a crystal-based semiconductor; forming a second amorphous-based semiconductor film including impurities showing one conductivity-type on the first amorphous-based semiconductor film; forming a semiconductor layer including impurities showing another conductivity-type different from the one conductivity-type on a second region of the one face of the crystal-based semiconductor; forming a first electrode on the second amorphous-based semiconductor film; and forming a second electrode on the semiconductor layer.

In the method of fabricating a photovoltaic cell, the first amorphous-based semiconductor film, second amorphous-based semiconductor film, and first electrode are formed in the first region on the one face of the crystal-based semiconductor film, whereas the semiconductor layer and second electrode are formed on the second region on the one face of the crystal-based semiconductor.

In this case, the crystal-based semiconductor receives light on the another-face side, causing holes and electrons to be produced, so that the produced holes are taken out of the cell by either a route passing through the first amorphous-based semiconductor film and second amorphous-based semiconductor film to the first electrode or a route passing through the semiconductor layer to the second electrode, while the produced electrons are taken out by an opposite route to the holes. In this case, the first electrode and the second electrode are provided on the one-face side, so that reflection and absorption losses of light incident from the another face of the crystal-based semiconductor can be suppressed. Hence by receiving light from the another face of the crystal-based semiconductor, the maximum use of incident light is realized.

Substantially the whole of the another face of the crystal-based semiconductor film may be a light-incident surface. In this case, a sufficient amount of light is incident from the another face, leading to the maximum use of the incident light.

The method of fabricating a photovoltaic cell may further comprise the step of forming an anti-reflection film on the another face of the crystal-based semiconductor.

In this case, incident light is efficiently transmitted inside the photovoltaic cell, so that more of the incident light can be used.

A method of fabricating a photovoltaic cell according to still another aspect of the present invention comprises the steps of: forming an intrinsic first amorphous-based semiconductor film on one face of a crystal-based semiconductor; forming a second amorphous-based semiconductor film including impurities showing one conductivity-type on a first region of the first crystal-based semiconductor film; forming a third amorphous-based semiconductor film including impurities showing another conductivity-type different from the one conductivity-type on a second region of the first amorphous-based semiconductor film and the second amorphous-based semiconductor film; forming a first electrode on the third amorphous-based semiconductor film on top of the first region; and forming a second electrode on the third amorphous-based semiconductor film on top of the second region.

In the method of fabricating a photovoltaic cell, the first intrinsic amorphous-based semiconductor film is formed on a one side of the crystal-based semiconductor, and the second amorphous-based semiconductor film including impurities showing the one conductivity-type is formed on the first region of the first amorphous-based semiconductor film.

Also, the third amorphous-based semiconductor film including impurities showing the another conductivity-type is formed on the second region of the first amorphous-based semiconductor film and the second amorphous-based semiconductor film.

In addition, the first electrode is formed on the third amorphous-based semiconductor film on top of the first region, and the second electrode is formed on the third amorphous-based semiconductor film on top of the second region.

In this case, a step of coating the second amorphous-based semiconductor film with a mask is eliminated in the formation of the third amorphous-based semiconductor film. This results in reduced manufacturing cost and manufacturing time.

Moreover, in the method of fabricating a photovoltaic cell according to the present invention, the crystal-based semiconductor receives light on the another-face side, causing holes and electrons to be produced, so that the produced holes are taken out of the cell by either a route passing through the first amorphous-based semiconductor film, second amorphous-based semiconductor film and third amorphous-based semiconductor film to the first electrode or a route passing through the first amorphous-based semiconductor film and third amorphous-based semiconductor film to the second electrode, while the produced electrons are taken out by an opposite route to the holes. In this case, the first electrode and the second electrode are provided on the one-face side, so that reflection and absorption losses of light via an electrode on another face of the crystal-based semiconductor are prevented. Hence by receiving light from the another face of the crystal-based semiconductor, the maximum use of incident light is realized.

A method of fabricating a photovoltaic cell according to still another aspect of the present invention comprises the steps of: forming an intrinsic first amorphous-based semiconductor film on a first region of one face of a crystal-based semiconductor; forming a second amorphous-based semiconductor film including impurities showing one conductivity-type on the first amorphous-based semiconductor film; forming a first electrode on the second amorphous-based semiconductor film; forming an intrinsic third amorphous-based semiconductor film on a second region of the one face of the crystal-based semiconductor and the first electrode; forming a fourth amorphous-based semiconductor film including impurities showing another conductivity-type different from the one conductivity-type on the third amorphous-based semiconductor film; and forming a second electrode on the fourth amorphous-based semiconductor film on top of the second region.

In the method of fabricating a photovoltaic cell, the first intrinsic amorphous-based semiconductor film, second amorphous-based semiconductor film including impurities showing the one conductivity-type, and first electrode are formed on the first region of the one face of the crystal-based semiconductor.

Also, the third intrinsic amorphous-based semiconductor film and the fourth amorphous-based semiconductor film including impurities showing the another conductivity-type are formed on the second region on the one face of the crystal-based semiconductor and the first electrode.

In addition, the second electrode is formed on the fourth amorphous-based semiconductor film on top of the second region.

In this case, a step of coating the first electrode with a mask is eliminated in the formation of the third amorphous-based semiconductor film and the fourth amorphous-based semiconductor film. This results in reduced manufacturing cost and manufacturing time.

Moreover, in the photovoltaic cell fabricated in the method according to the present invention, the crystal-based semiconductor receives light on the another-face side, causing holes and electrons to be produced, so that the produced holes are taken out of the cell by either a route passing through the first amorphous-based semiconductor film, second amorphous-based semiconductor film and third amorphous-based semiconductor film to the first electrode or a route passing through the first amorphous-based semiconductor film and third amorphous-based semiconductor film to the second electrode, while the produced electrons are taken out by an opposite route to the holes. In this case, the first electrode and the second electrode are provided on the one-face side, so that light is not reduced on the another-face side of the crystal-based semiconductor. Hence, by receiving light from the another face of the crystal-based semiconductor, the maximum use of incident light is realized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1b is a partly enlarged view of FIG. 1a;

DESCRIPTION OF THE PREFERRED EMBODIMENTS (First Embodiment)

A first embodiment of the present invention will hereinafter be described.

Figure 1A:
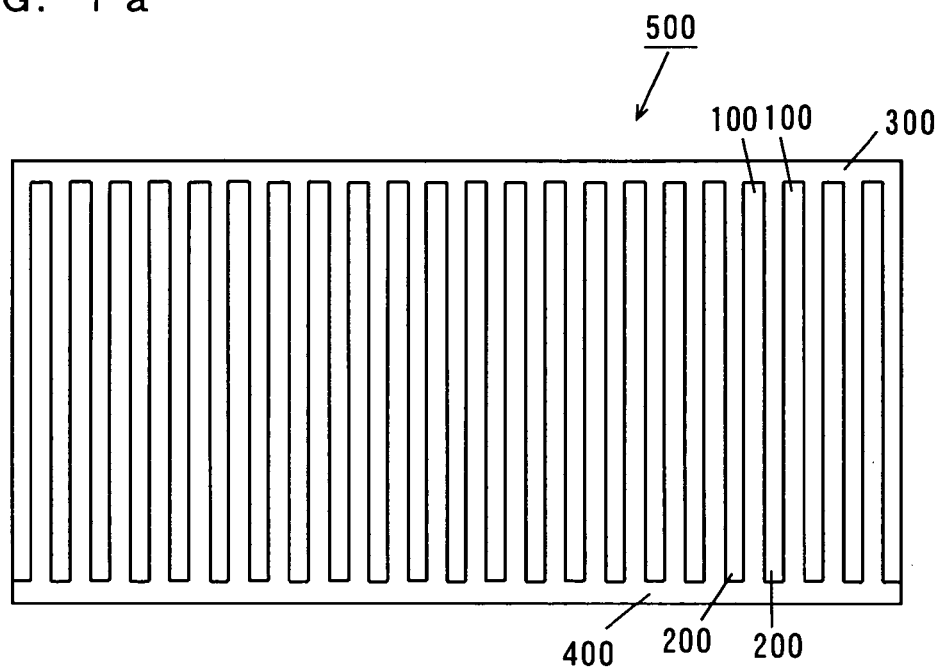
FIG. 1a is a plan view showing the back surface of a photovoltaic cell according to a first embodiment.
Figure 1B:
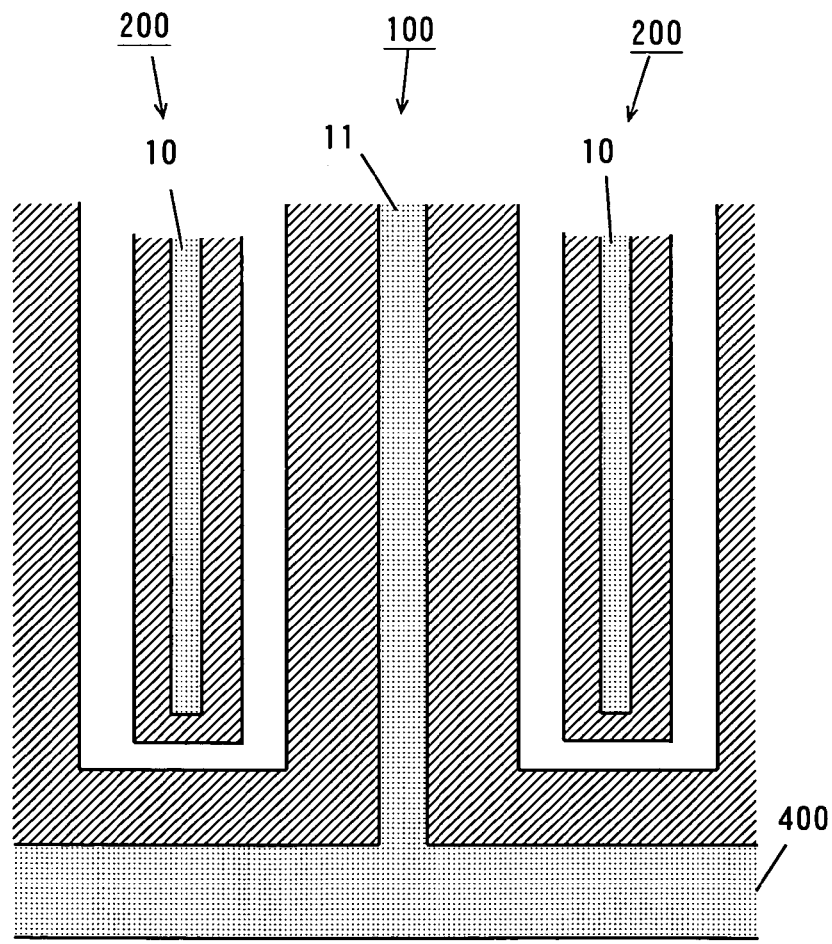

FIG. 1a is a plan view showing the back surface of a photovoltaic cell 500 according to this embodiment, and FIG. 1b is a partly enlarged view of FIG. 1a.

As shown in FIG. 1a, the photovoltaic cell 500 has a rectangular shape with its shorter side being 5 cm and longer side 10 cm, for example. The back surface of the photovoltaic cell 500 comprises positive electrodes 100 and negative electrodes 200 in a comb-shape. The positive electrodes 100 and negative electrodes 200 align alternately, each extending in the direction of the shorter side of the photovoltaic cell 500. Electrodes 300, 400 are also provided along the respective longer sides of the back surface of the photovoltaic cell 500.

As shown in FIG. 1b, the positive electrode 100 and the negative electrode 200 are provided with collector electrodes 11, 10, respectively. The collector electrode 10 is connected to the positive electrode 300, whereas the collector electrode 11 is connected to the electrode 400.

Figure 2:
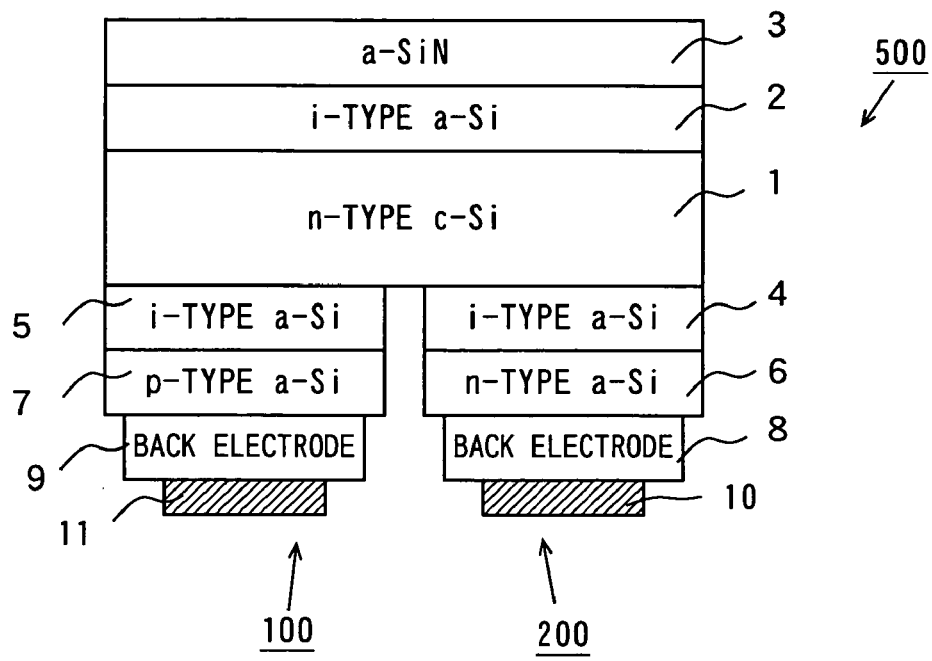
FIG. 2 is a schematic cross section showing the structure of the photovoltaic cell according to the first embodiment.

FIG. 2 is a schematic cross section showing the structure of the photovoltaic cell 500 according to this embodiment.

As shown in FIG. 2, an i-type amorphous silicon film 2 (non-doped amorphous silicon film) and an anti-reflection film 3 made of amorphous silicon nitride or the like, are formed in this order on a main surface (surface of the front side) of an n-type single-crystalline silicon substrate 1. The front surface of the n-type single-crystalline silicon substrate 1 is the light-incident surface. On the back surface of the n-type single-crystalline silicon substrate 1 are provided the positive electrode 100 and the negative electrode 200 next to each other.

The positive electrode 100 includes a back electrode 9 and a collector electrode 11 formed in this order on an i-type amorphous silicon film 5 and a p-type amorphous silicon film 7 formed on the back surface of the n-type single-crystalline silicon substrate 1. The negative electrode 200 includes a back electrode 8 and a collector electrode 10 formed in this order on an i-type amorphous silicon film 4 and an n-type amorphous silicon film 6 formed on the back surface of the n-type single-crystalline silicon substrate 1. In the photovoltaic cell 500 of FIG. 2, the n-type single-crystalline silicon substrate 1 is the primary power generating layer.

The back electrodes 8, 9 are each transparent electrodes made of ITO (Indium Tin Oxide), $SnO_2$ (Tin Oxide), ZnO (Zinc Oxide), or the like. The collector electrodes 10, 11 are each made of Ag (Silver) or the like.

The i-type amorphous silicon film 2 may have, but not limited to, a thickness of about 10 nm, for example; the anti-reflection film 3 having a thickness of about 70 nm, for example; the i-type amorphous silicon films 4, 5 having a thickness of about 15 nm, for example; the n-type amorphous silicon film 6 having a thickness of about 20 nm, for example; the p-type amorphous silicon film 7 having a thickness of about 10 nm, for example; the back electrodes 8, 9 having a thickness of about 70 nm, for example; the collector electrodes 10, 11 having a thickness of about 200 nm, for example.

Note that a shortened carrier travel distance between the n-type single-crystalline silicon substrate 1 and the p-type amorphous silicon film 7 enhances power generation efficiency; so that it is preferable that the width of the p-type amorphous silicon film 7 is wider than that of the n-type amorphous silicon film 6.

The photovoltaic cell 500 in this embodiment has, for improved p-n junction characteristics, an HIT structure in which the i-type amorphous silicon film 5 is provided between the n-type single crystalline silicon substrate 1 and p-type amorphous silicon film 7. The photovoltaic cell 500 has, for preventing recombination of carriers, a BSF (Back Surface Field) structure in which the i-type amorphous silicon film 4 and the n-type amorphous silicon film 6 are provided on the back surface of the n-type single-crystalline silicon substrate 1.

The fabrication method of the photovoltaic cell 500 of FIG. 2 will now be described. First, the n-type single-crystalline substrate 1 after cleaned is heated in a vacuum chamber. This removes moisture attached on the surface of the n-type single-crystalline silicon substrate 1. Then, $H_2$ (hydrogen) gas is introduced into the vacuum chamber to clean the surface of the n-type single-crystalline silicon substrate 1 by plasma discharge.

$SiH_4$ (silane) gas and $H_2$ gas are subsequently introduced into the vacuum chamber to form the i-type amorphous silicon film 2 on the main surface of the n-type single-crystalline silicon substrate 1 by plasma CVD (Chemical Vapor Deposition) $SiH_4$ gas and $NH_3$ (ammonium) gas are then introduced into the vacuum chamber to form the anti-reflection film 3 on the i-type amorphous silicon film 2 by plasma CVD.

After this, part of the back surface of the n-type single-crystalline silicon substrate 1 is coated with a metal mask. $SiH_4$ gas and $H_2$ gas are then introduced into the vacuum chamber to form the i-type amorphous silicon film 5 by plasma CVD on the back surface of the n-type single-crystalline silicon substrate 1 except the part of the metal mask. $SiH_4$ gas, $H_2$ gas, and $B_2H_6$ gas are subsequently introduced into the vacuum chamber to form the p-type amorphous silicon film 7 on the i-type amorphous silicon film 5 by plasma CVD.

Next, part of the back surface of the n-type single-crystalline silicon substrate 1 is coated with a metal mask so as to cover the i-type amorphous silicon film 5 and the p-type amorphous silicon film 7. $SiH_4$ gas and $H_2$ gas are then introduced into the vacuum chamber to form the i-type amorphous silicon film 4 on the back surface of the n-type single-crystalline silicon substrate 1 except the part of the metal mask by plasma CVD. $SiH_4$ gas, $H_2$ gas, and $PH_3$ (phosphine) gas are subsequently introduced into the vacuum chamber to form the n-type amorphous silicon film 6 on the i-type amorphous silicon film 4 by plasma CVD.

Then, the back electrodes 8, 9 are formed on the n-type amorphous silicon film 6 and the p-type amorphous silicon film 7, respectively by sputtering, after which the collector electrodes 10, 11 are formed on the back electrodes 8, 9, respectively by screen-printing.

In the photovoltaic cell 500 according to this embodiment, it is not necessary to provide a conductive silicon film, a transparent electrode, and a collector electrode on the light-incident surface which may prevent effective use of incident light. This leads to a reduction in manufacturing steps and cost, as well as to the maximum use of incident light, so that the output voltage and fill factor can be maximized.

While silicon nitride is used for the anti-reflection film 3 in this embodiment, silicon oxide may be used instead. In addition, in the photovoltaic cell 500 according to this embodiment, surface defects present on the main surface of the n-type single-crystalline silicon substrate 1 are terminated with the i-type amorphous silicon film 2, so that the anti-reflection film 3 can be made of any material having good light transparency and capable of preventing the reflection of incident light, without consideration of the interface characteristics of the main surface. Note that silicon has a refractive index of about 3.4, and a sealing material such as EVA (ethylene-vinylacetate resin) which covers the photovoltaic cell 500 at the time of its use has a refractive index of about 1.5; so that any material having a refractive index of 1.5 to 3.4 may be used as the anti-reflection film 3. Table 1 shows examples of such materials.

TABLE 1

|  | MATERIAL | REFRACTIVE INDEX | WAVELENGTH (nm) |
|---|---|---|---|
| 1.5 < n < 2.0 | $LaF_2$ | 1.59 | 550 |
|  | $NdF_3$ | 1.60 | 550 |
|  | $Al_2O_3$ | 1.62 | 600 |
|  | $CoF_3$ | 1.63 | 550 |
|  | $PbF_2$ | 1.75 | 550 |
|  | MgO | 1.75 | 500 |
|  | $ThO_2$ | 1.80 | 550 |
|  | $SnO_2$ | 1.90 | 550 |
|  | $La_2O_3$ | 1.95 | 550 |
|  | SiO | 1.7–2.0 | 550 |
| 2 < n < 3 | $In_2O_3$ | 2.00 | 500 |
|  | $Nd_2O_3$ | 2.00 | 550 |
|  | $Sb_2O_3$ | 2.04 | 548 |
|  | $ZrO_2$ | 2.10 | 550 |
|  | $CoO_2$ | 2.20 | 550 |
|  | $TiO_2$ | 2.2–2.7 | 550 |
|  | ZnS | 2.35 | 550 |
|  | $Bi_2O_3$ | 2.45 | 550 |
|  | ZnSe | 2.58 | 633 |
|  | CdSe | 2.60 | 600 |

The n-type amorphous silicon film 6 in this embodiment is doped with P (phosphor) as impurities; however, a group V element such as As (arsenic), for example, may alternatively be doped as impurities. The p-type amorphous silicon film 7 is doped with B (boron) as impurities; however, a group III element such as Al (aluminum) or Ga (gallium), for example, may alternatively be doped as impurities. Moreover, an n-type polycrystalline silicon substrate may be used instead of the n-type single-crystalline substrate 1. The i-type amorphous silicon films 2, 4, 5, the n-type amorphous silicon film 6, and the p-type amorphous silicon film 7 may each include microcrystalline silicon.

Further, instead of the n-type single-crystalline substrate 1, i-type amorphous silicon films 2, 4, 5, n-type amorphous silicon film 6, and p-type amorphous silicon film 7 in this embodiment, other group IV elements such as SiC (silicon carbonate), SiGe (silicon germanium), and Ge (germanium) may be used.

In the photovoltaic cell 500 according to this embodiment the n-type single crystalline silicon substrate 1 is used; however, any other types of substrates may instead be used. For example, an i-type amorphous silicon film and a silicon nitride film may be formed on the main surface of a p-type single-crystalline silicon substrate, while the positive electrode 100 and the negative electrode 200 similar to those of the photovoltaic cell 500 according to this embodiment are provided on the back surface thereof.

Furthermore, the present invention is applicable to photovoltaic cells having various other structures without limited to the structure of the photovoltaic cell 500 shown in FIG. 2. The provision of the i-type amorphous silicon film 4 and the n-type amorphous silicon film 6 on the n-type single-crystalline silicon substrate 1 may, for example, be eliminated.

In this embodiment, the p-type corresponds to one conductivity-type, and the n-type corresponds to another conductivity-type; however, the n-type may correspond to one conductivity-type with the p-type corresponding to another conductivity-type.

(Second Embodiment)

A second embodiment of the present invention will hereinafter be described.

Figure 3:
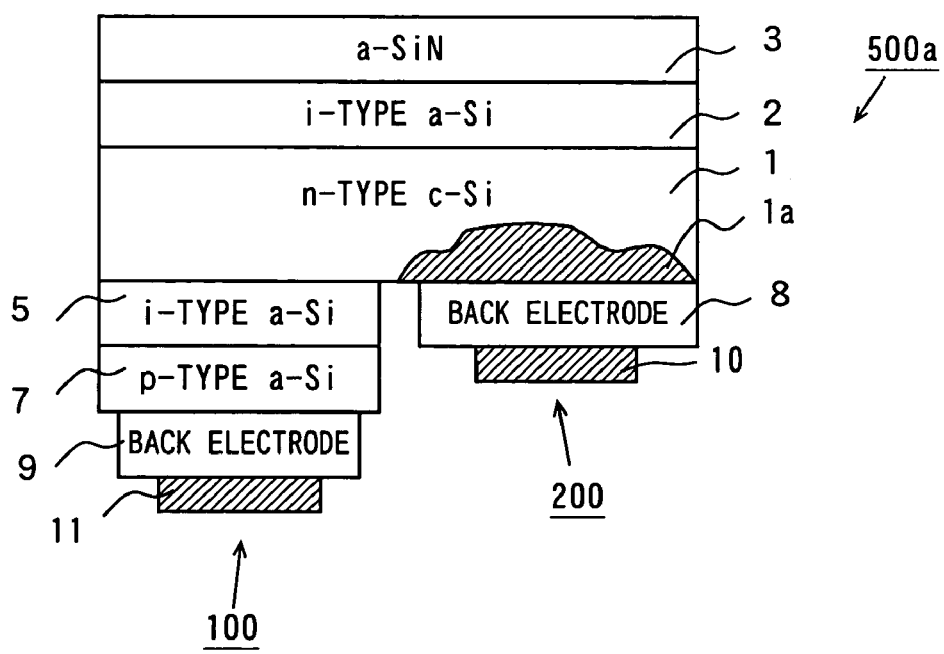
FIG. 3 is a schematic cross section showing the structure of a photovoltaic cell according to a second embodiment.

FIG. 3 is a schematic cross section showing the structure of a photovoltaic cell 500*a* according to the second embodiment. The photovoltaic cell 500*a* of FIG. 3 differs from the photovoltaic cell 500 of FIG. 1 in that it comprises impurities diffusion layer 1*a* in an n-type single-crystalline silicon substrate 1, instead of the i-type amorphous silicon film 4 and the n-type amorphous silicon film 6.

The impurity diffusion layer 1*a* is formed by thermal diffusion of P (phosphor) with high concentration on part of the region of the back surface of the n-type single-crystalline silicon substrate 1 where an i-type amorphous silicon film 5 is not formed. Then, a back electrode 8 and a collector electrode 10 are formed on the impurity diffusion layer 1*a*.

In this embodiment, it is not necessary to form an i-type amorphous silicon film 4 and an n-type amorphous silicon film 6 in the fabrication of the negative electrode 200, so that reduced manufacturing steps can be achieved.

(Third Embodiment)

A third embodiment of the present invention will hereinafter be described.

Figure 4:
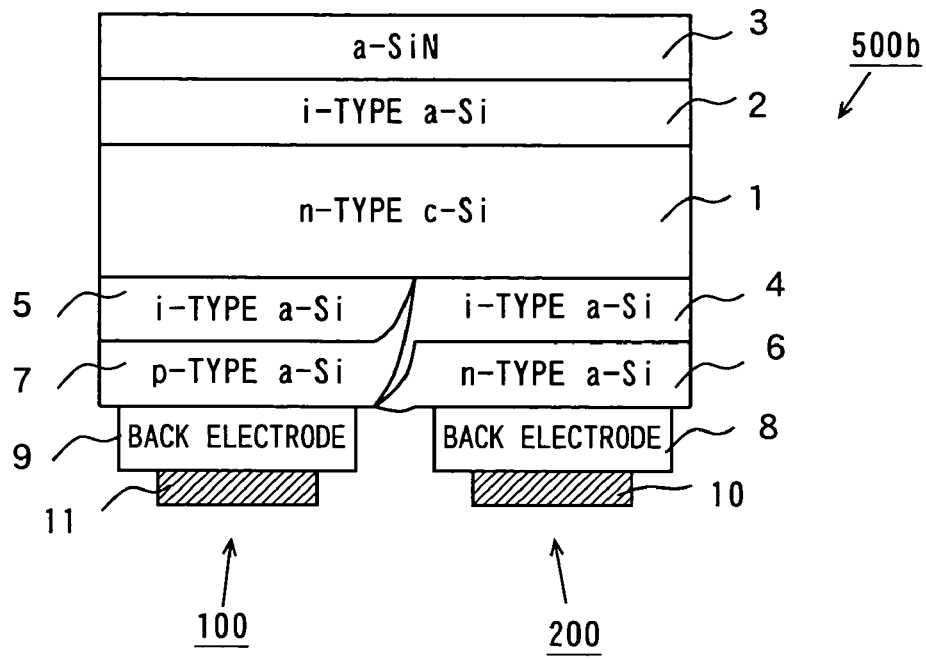
FIG. 4 is a schematic cross section showing the structure of a photovoltaic cell according to a third embodiment.

FIG. 4 is a schematic cross section showing the structure of a photovoltaic cell 500*b* according to the third embodiment. The photovoltaic cell 500*b* of FIG. 4 differs from the photovoltaic cell 500 of FIG. 1 in that an i-type amorphous silicon film 4 is in contact with an end of a p-type amorphous silicon film 7.

The method of fabricating the photovoltaic cell 500*b* will now be described. The method of forming an i-type amorphous silicon film 2 and an anti-reflection film 3 on the main-surface side of an n-type single-crystalline silicon substrate 1, and an i-type amorphous silicon film 5 and a p-type amorphous silicon film 7 on the back-surface side thereof is the same as that for the photovoltaic cell 500 of FIG. 2.

At the time of formation of the i-type amorphous silicon film 4 and n-type amorphous silicon film 6, a metal mask is coated so that its end face is aligned with the end faces of the i-type amorphous silicon film 5 and the p-type amorphous silicon film 7. The entire surface of the n-type single-crystalline silicon substrate 1 is thus covered with the i-type amorphous silicon films 4, 5. As a result, recombination of carriers at an exposed portion of the n-type single-crystalline silicon substrate 1 is prevented, resulting in enhanced power generation efficiency.

(Fourth Embodiment)

A fourth embodiment of the present invention will hereinafter be described.

Figure 5:
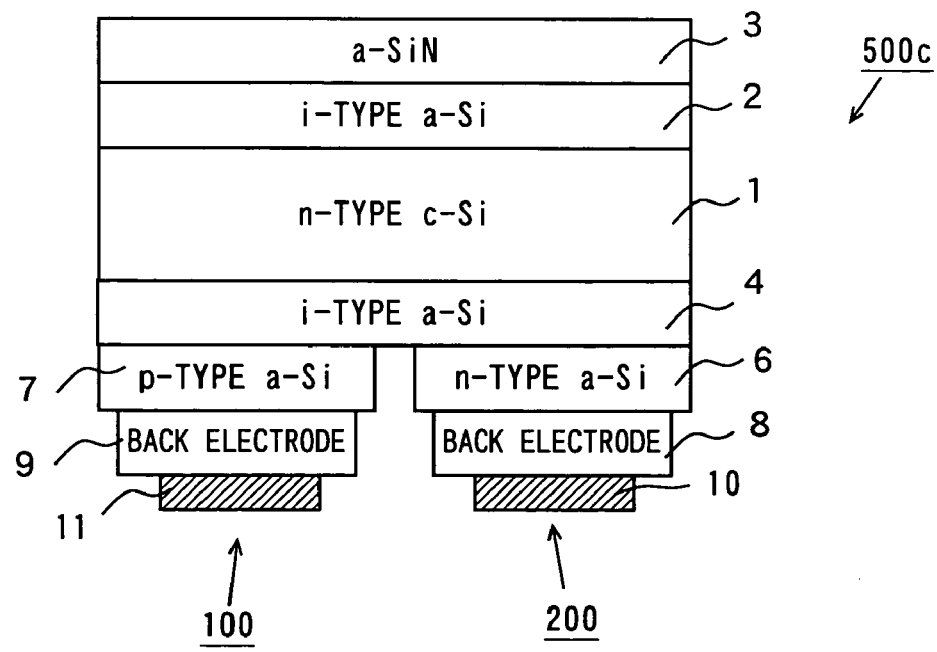
FIG. 5 is a schematic cross section showing the structure of a photovoltaic cell according to a fourth embodiment.

FIG. 5 is a schematic cross section showing the structure of a photovoltaic cell 500*c* according to the fourth embodiment. The photovoltaic cell 500*c* of FIG. 5 differs from the photovoltaic cell 500 of FIG. 1 in that an i-type amorphous silicon film 4 is formed on the entire back surface of an n-type single-crystalline silicon substrate 1. This prevents recombination of carriers at an exposed portion of the n-type single-crystalline silicon substrate 1, resulting in enhanced power generation efficiency.

The method of fabricating the photovoltaic cell 500*c* of FIG. 5 will now be described. The method for forming an i-type amorphous silicon film 2 and an anti-reflection film 3 on the main-surface side of the n-type single-crystalline silicon substrate 1 is the same as that for the photovoltaic cell 500 of FIG. 2.

The i-type amorphous silicon film 4 is formed on the entire back surface of the n-type single-crystalline silicon substrate 1, and subsequently the n-type amorphous silicon film 6 and the p-type amorphous silicon film 7 are formed. This eliminates the need to form the i-type amorphous silicon film 5, resulting in reduced manufacturing steps.

(Fifth Embodiment)

A fifth embodiment of the present invention will hereinafter be described.

Figure 6:
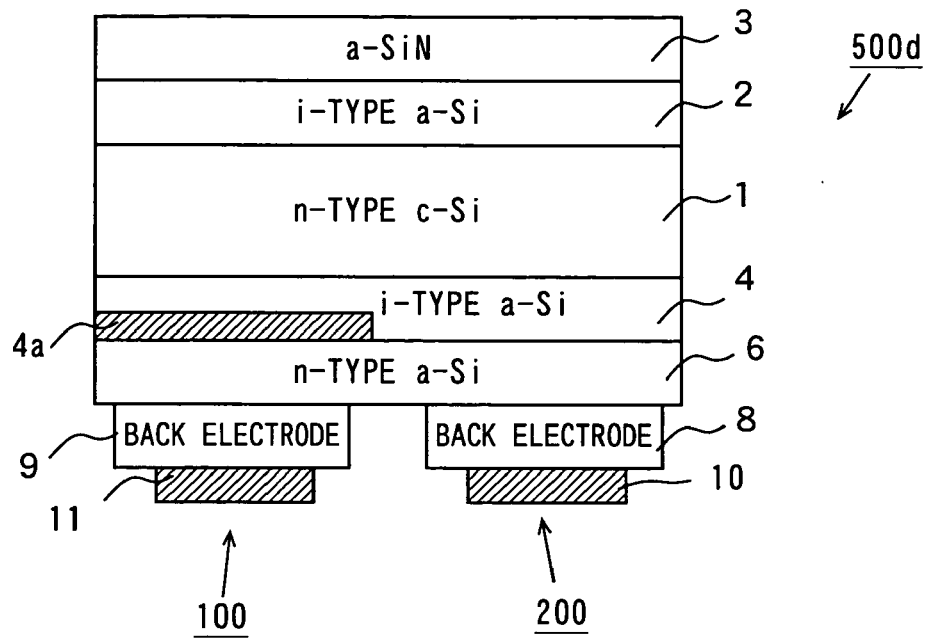
FIG. 6 is a schematic cross section showing the structure of a photovoltaic cell according to a fifth embodiment.

FIG. 6 is a schematic cross section showing the structure of a photovoltaic cell 500*d* according to the fifth embodiment. The photovoltaic cell 500*d* of FIG. 6 differs from the photovoltaic cell 500*c* of FIG. 5 in that impurities diffusion layer 4*a* is formed in an i-type amorphous silicon film 4, and an n-type amorphous silicon film 6 is formed on the entire surface of the i-type amorphous silicon film 4.

The method of fabricating the photovoltaic cell 500*d* of FIG. 6 will now be described. The method for forming an i-type amorphous silicon film 2 and an anti-reflection film 3 on the main-surface side of the n-type single-crystalline silicon substrate 1 is the same as that for the photovoltaic cell 500 of FIG. 2.

Part of the region on the i-type amorphous silicon film 4 is coated with a metal mask. Then, the i-type amorphous silicon film 4 is doped with a group III element such as B with high concentration by plasma doping, to form the impurity diffusion layer 4*a*. After that, the n-type amorphous silicon film 6 is formed on the entire surface of the i-type amorphous silicon film 4.

In this embodiment, the step of coating a metal mask at the time of formation of the n-type amorphous silicon film 6 is eliminated, so that reduced manufacturing steps can be achieved. With the thickness of the n-type amorphous silicon film 6 being very small, a p-n junction between the impurity diffusion layer 4*a* and the n-type amorphous silicon film 6 exerts little influence on the power generation efficiency.

(Sixth Embodiment)

A sixth embodiment of the present invention will hereinafter be described.

Figure 7:
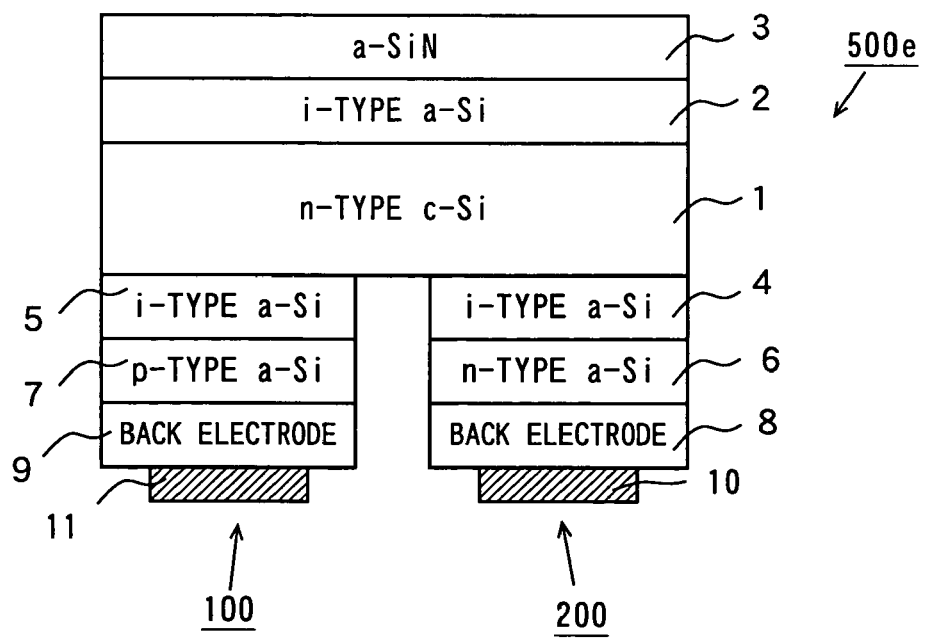
FIG. 7 is a schematic cross section showing the structure of a photovoltaic cell according to a sixth embodiment.

FIG. 7 is a schematic cross section showing the structure of a photovoltaic cell 500e according to the sixth embodiment. The photovoltaic cell 500e of FIG. 7 differs from the photovoltaic cell 500 of FIG. 1 in that a back electrode 9 is formed on the entire surface of a p-type amorphous silicon film 7, and a back electrode 8 is formed on the entire surface of an n-type amorphous silicon film 6.

The method of fabricating the photovoltaic cell 500e of FIG. 7 will now be described. The method for forming an i-type amorphous silicon film 2 and an anti-reflection film 3 on the main-surface side of the n-type single-crystalline silicon substrate 1 is the same as that for the photovoltaic cell 500 of FIG. 2.

The back electrode 9 is formed with the metal mask used in forming the p-type amorphous silicon film 7, and the back electrode 8 is formed with the metal mask used in forming the n-type amorphous silicon film 6. This allows the back electrode 9 to be formed on the entire surface of the p-type amorphous silicon film 7 with the back electrode 8 formed on the entire surface of the n-type amorphous silicon film 6. In this case, the number of times that a metal mask is positioned can be reduced, which is efficient.

Alternatively, a lift-off layer made of a linear resin may be formed between the i-type amorphous silicon film 4 and the i-type amorphous silicon film 5 by screen-printing, previously before the formation of the i-type amorphous silicon films 4, 5 by the CVD.

In this case, the i-type amorphous silicon films 4, 5, the n-type amorphous silicon film 6, and the p-type amorphous silicon film 7 are formed with the method of FIG. 5, and a back electrode is formed on the entire surfaces of the n-type amorphous silicon film 6, p-type amorphous silicon film 7, and lift-off layer, after which the lift-layer is removed. This results in the formation of the back electrodes 8, 9.

Alternatively, the back electrodes 8, 9 may be formed as follows: the n-type amorphous silicon film 6 and the p-type amorphous silicon film 7 in the photovoltaic cell 500 of FIG. 2 are formed, and subsequently, a back electrode is formed on an exposed portion of the n-type amorphous silicon film 6, p-type amorphous silicon film 7, and n-type single-crystalline silicon substrate 1, after which undesired region of the back electrode is removed by laser scribing. By adjusting laser irradiation conditions, it is possible to selectively remove part of the back electrode.

In this case, such a laser type as SHG (Second Harmonic Generation), THG (Third Harmonic Generation) or the like of excimer or YAG (Yttrium Aluminum Garnet) may be used.

Note also that instead of laser scribing, mechanical scribing may be used to remove undesired region of the back electrode.

In the photovoltaic cell 500e according to this embodiment, the back electrodes 8, 9 are formed on the entire surfaces of the n-type amorphous silicon film 6 and the p-type amorphous silicon film 7, respectively, so that carriers can be efficiently collected though the n-type amorphous silicon film 6 and the p-type amorphous silicon film 7. This results in enhanced power generation efficiency of the photovoltaic cell 500e.

(Seventh Embodiment)

A seventh embodiment of the present invention will hereinafter be described.

Figure 8:
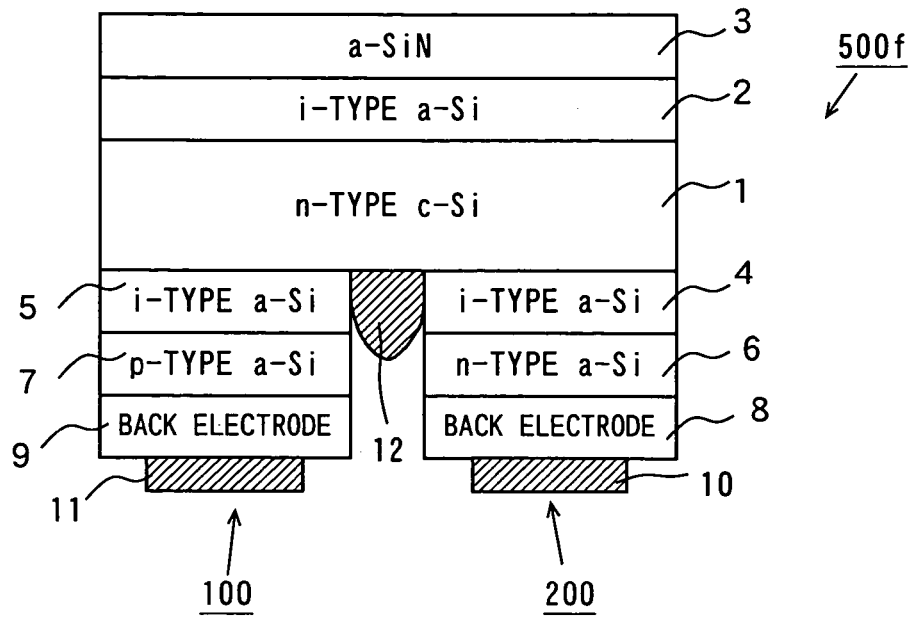
FIG. 8 is a schematic cross section showing the structure of a photovoltaic cell according to a seventh embodiment.

FIG. 8 is a schematic cross section showing the structure of a photovoltaic cell 500f according to the seventh embodiment. The photovoltaic cell 500f of FIG. 8 differs from the photovoltaic cell 500e of FIG. 7 in that a protective layer 12 made of a resin or the like is formed between an i-type amorphous silicon film 5 and an i-type amorphous silicon film 4.

By forming the protective layer 12 by screen-printing previously before the i-type amorphous silicon films 4, 5 are formed, an n-type single-crystalline silicon substrate 1 can be prevented from being damaged during the removal of undesired region of a back electrode with such technique as laser scribing or mechanical scribing explained in FIG. 7.

(Eight Embodiment)

An eighth embodiment of the present invention will hereinafter be described.

Figure 9:
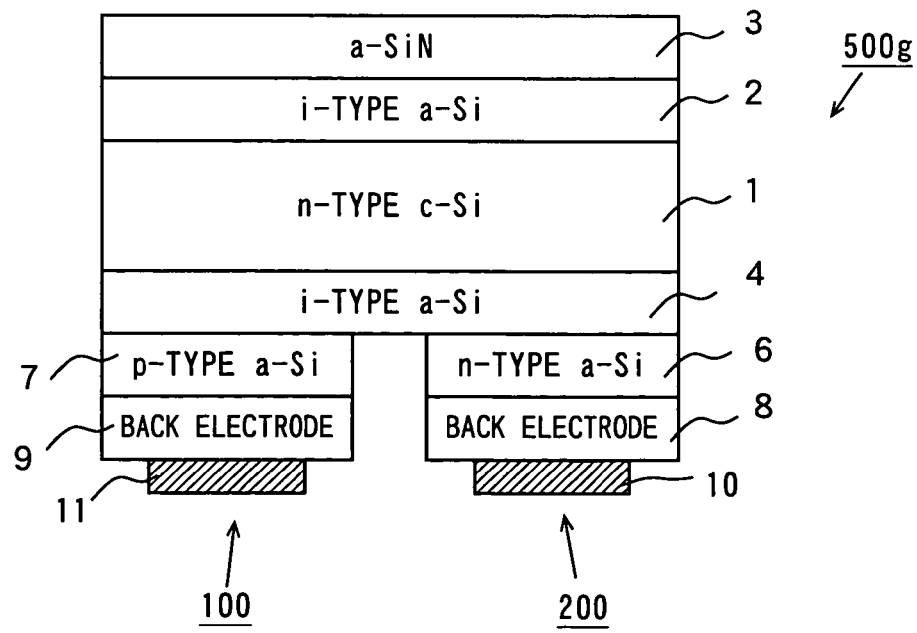
FIG. 9 is a schematic cross section showing the structure of a photovoltaic cell according to an eighth embodiment.

FIG. 9 is a schematic cross section showing the structure of a photovoltaic cell 500g according to the eighth embodiment. The photovoltaic cell 500g of FIG. 9 differs from the photovoltaic cell of FIG. 7 in that an i-type amorphous silicon film 4 is formed on the entire back surface of an n-type single-crystalline substrate 1.

After up to the i-type amorphous silicon film 4 has been formed with the technique explained in FIG. 5, an n-type amorphous silicon film 6, a p-type amorphous silicon film 7, back electrodes 8, 9, and collector electrodes 10, 11 are formed with the technique explained in FIG. 7, resulting in the fabrication of the photovoltaic cell 500g of FIG. 9.

In the photovoltaic cell 500g according to this embodiment, the i-type amorphous silicon film 4 is formed on the entire back surface of the n-type single-crystalline silicon substrate 1, so that surface recombination of carriers at an exposed portion of the n-type single-crystalline silicon substrate 1 can be prevented. In addition, with the back electrodes 8, 9 being formed on the entire surfaces of the n-type amorphous silicon film 6 and the p-type amorphous silicon film 7, carriers can be efficiently collected from the n-type amorphous silicon film 6 and the p-type amorphous silicon film 7. This results in further enhanced power generation efficiency.

(Ninth Embodiment)

A ninth embodiment of the present invention will hereinafter be described.

Figure 10:
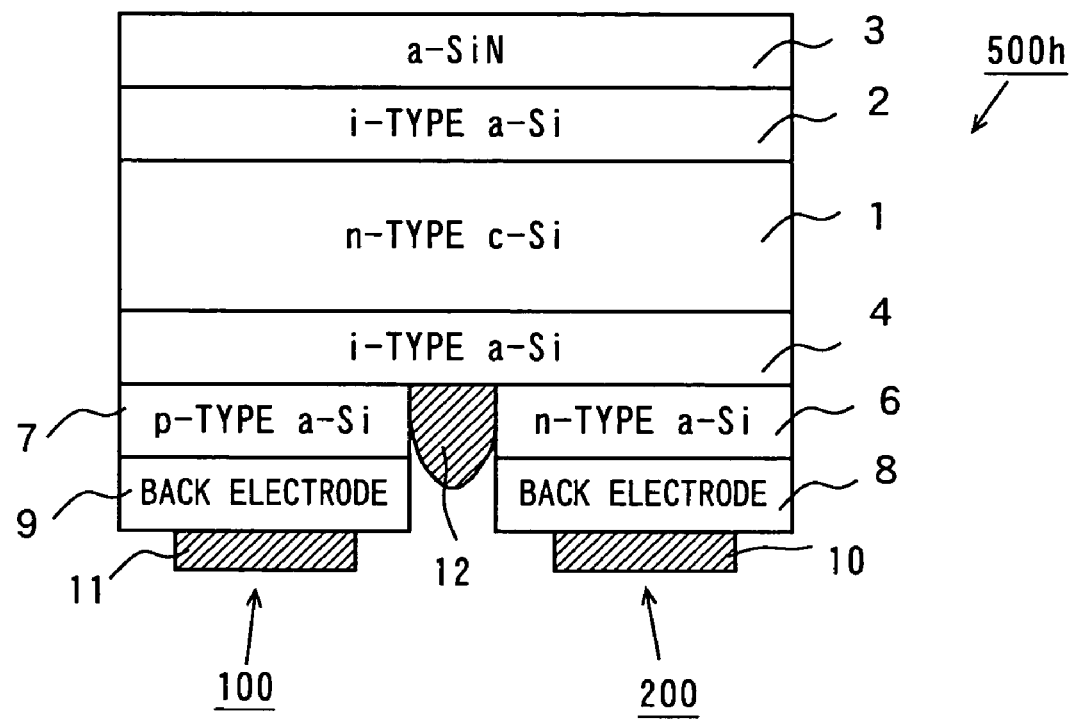
FIG. 10 is a schematic cross section showing the structure of a photovoltaic cell according to a ninth embodiment.

FIG. 10 is a schematic cross section showing the structure of a photovoltaic cell 500h according to a ninth embodiment. The photovoltaic cell 500h of FIG. 10 differs from the photovoltaic cell 500e of FIG. 7 in that an i-type amorphous silicon film 4 is formed on the entire back surface of an n-type single-crystalline silicon substrate 1 with a protective layer 12 made of a resin or the like formed between an n-type amorphous silicon film 6 and a p-type amorphous silicon film 7.

By forming the protective layer 12 by screen-printing previously before the n-type amorphous silicon film 6 and the p-type amorphous silicon film 7 are formed, the i-type amorphous silicon film 4 can be prevented from being damaged during the removal of undesired region of a back electrode with such technique as laser scribing or mechanical scribing explained in FIG. 7.

In the photovoltaic cell 500h according to this embodiment, the i-type amorphous silicon film 4 is formed on the entire back surface of the n-type single-crystalline silicon substrate 1, so that surface recombination of carriers at an exposed portion of the n-type single-crystalline silicon substrate 1 can be prevented. In addition, with the back electrodes 8, 9 being formed on the entire surfaces of the n-type amorphous silicon film 6 and the p-type amorphous silicon film 7, carriers can be efficiently collected from the n-type amorphous silicon film 6 and the p-type amorphous silicon film 7. This results in further enhanced power generation efficiency.

(Tenth Embodiment)

A tenth embodiment of the present invention will hereinafter be described.

Figure 11:
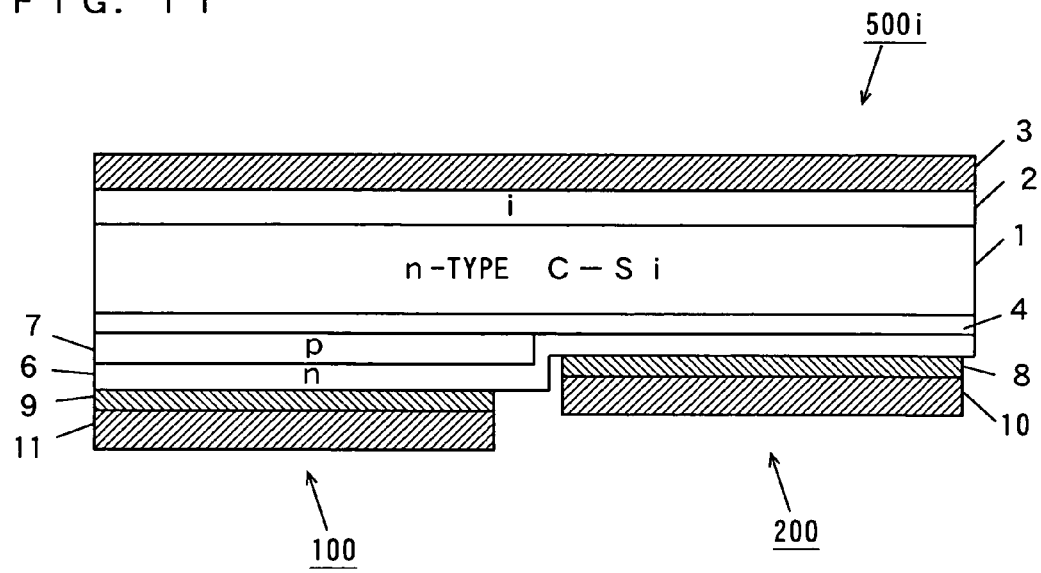
FIG. 11 is a schematic cross section showing the structure of a photovoltaic cell according to a tenth embodiment.

FIG. 11 is a schematic cross section showing the structure of a photovoltaic cell according to this embodiment.

In the photovoltaic cell of FIG. 11, a p-type amorphous silicon film 7 is formed on an i-type amorphous silicon film 4, instead of the impurity diffusion layer 4a within the i-type amorphous silicon film 4 as shown in FIG. 6.

As shown in FIG. 11, an i-type amorphous silicon film 2 (non-doped amorphous silicon film) and an anti-reflection film 3 made of silicon nitride or the like are formed in this order on a main surface (surface of the front side) of an n-type single-crystalline silicon substrate 1.

The i-type amorphous silicon film 4 is formed on the back surface of the n-type single-crystalline silicon substrate 1. A p-type amorphous silicon film 7 is formed on part of the i-type amorphous silicon film 4. An n-type amorphous silicon film 6 is formed on the entire surfaces of the i-type amorphous silicon film 4 and the p-type amorphous silicon film 7. A back electrode 9 and a collector electrode 11 are formed in this order on the p-type amorphous silicon film 7 with the n-type amorphous silicon film 6 therebetween. A back electrode 8 and a collector electrode 10 are formed in this order on the n-type amorphous silicon film 6 where the p-type amorphous silicon film 7 is not present. In the photovoltaic cell of FIG. 11, the n-type single-crystalline silicon substrate 1 serves as the primary power generating layer.

Note that the p-type amorphous silicon film 7, n-type amorphous silicon film 6, back electrode 9, and collector electrode 11 constitute a positive electrode 100, while the n-type amorphous silicon film 6, back electrode 8, and collector electrode 10 constitute a negative electrode 200.

The back electrodes 8, 9 are each transparent electrodes made of ITO (Indium Tin Oxide), $SnO_2$ (Tin Oxide), ZnO (Zinc Oxide) or the like, and the collector electrodes 10, 11 are each made of Ag (silver) or the like.

The i-type amorphous silicon film 2 may have, but not limited to, a thickness of about 10 nm, for example; the anti-reflection film 3 having a thickness of about 70 nm, for example; the i-type amorphous silicon films 4, 5 having a thickness of about 15 nm, for example; the n-type amorphous silicon film 6 having a thickness of about 20 nm, for example; the p-type amorphous silicon film 7 having a thickness of about 10 nm, for example; the back electrodes 8, 9 having a thickness of about 70 nm, for example; the collector electrodes 10, 11 having a thickness of about 200 nm, for example.

Note that a shortened carrier travel distance between the n-type single-crystalline silicon substrate 1 and the p-type amorphous silicon film 7 enhances power generation efficiency; so that it is preferable that the width of the p-type amorphous silicon film 7 is wider than that of the n-type amorphous silicon film 6 on the region where the p-type amorphous silicon film 7 is not present.

The positive electrode 100 of the photovoltaic cell in this embodiment has, for improved p-n junction characteristics, a HIT structure in which the i-type amorphous silicon film 4 is provided between the n-type single-crystalline substrate 1 and the p-type amorphous silicon film 7. The negative electrode 200 has, for preventing recombination of carriers, a BSF (Back Surface Field) structure in which the i-type amorphous silicon film 4 and the n-type amorphous silicon film 6 are provided on the back surface of the n-type single-crystalline silicon substrate 1.

The method of fabricating the photovoltaic cell 500i of FIG. 11 is now described. First, the n-type single-crystalline silicon substrate 1 after cleaned is heated in a vacuum chamber. This removes moisture attached on the surface of the n-type single-crystalline silicon substrate 1. Then, $H_2$ (hydrogen) gas is introduced into the vacuum chamber to clean the surface of the n-type single-crystalline silicon substrate 1 by plasma discharge.

$SiH_4$ (silane) gas and $H_2$ gas are subsequently introduced into the vacuum chamber to form the i-type amorphous silicon film 2 on the main surface of the n-type single-crystalline silicon substrate 1 by plasma CVD (Chemical Vapor Deposition). Then, $SiH_4$ gas and $NH_3$ (ammonium) gas are introduced to form the anti-reflection film 3 on the i-type amorphous silicon film 2 by plasma CVD.

$SiH_4$ gas and $H_2$ gas are subsequently introduced into the vacuum chamber to form the i-type amorphous silicon film 4 on the back surface of the n-type single-crystalline substrate 1 by plasma CVD.

After this, part of the i-type amorphous silicon film 4 is coated with a metal mask. $SiH_4$ gas, $H_2$ gas, and $B_2H_6$ (diborane) gas are then introduced into the vacuum chamber, to form the p-type amorphous silicon film 7 on the i-type amorphous silicon film 4 except the part of the metal mask by plasma CVD.

$SiH_4$ gas, $H_2$ gas, and $PH_3$ (phosphine) gas are subsequently introduced into the vacuum chamber, to form the n-type amorphous silicon film 6 on the p-type amorphous silicon film 7 and the i-type amorphous silicon film 4 by plasma CVD.

Next, a metal mask is set so as to cover the n-type amorphous silicon film 6 except the region where the p-type amorphous silicon film 7 is present. Then, the back electrode 9 and the collector electrode 11 are formed by sputtering on the n-type amorphous silicon film 6 except the part of the metal mask.

The collector electrode 11 is subsequently coated with a metal mask. Then, the back electrode 8 and the collector electrode 10 are formed by sputtering on the n-type amorphous silicon film 6 except the part of the metal mask.

In the photovoltaic cell according to this embodiment, it is not necessary to provide a conductive type silicon film, a transparent electrode, and a collector electrode on the light-incident surface which may prevent effective use of incident light. This leads to a reduction in manufacturing steps and cost, as well as to the maximum use of incident light, so that the output voltage and fill factor can be maximized.

Moreover, since the n-type amorphous silicon film 6 is formed on the i-type amorphous silicon film 4 and the p-type amorphous silicon film 7 without the use of a metal mask, the steps of using metal masks can be reduced. As a result, manufacturing cost and time can be reduced.

Note that with the thickness of the n-type amorphous silicon film 6 being very small, a p-n junction between the p-type amorphous silicon film 7 and the n-type amorphous silicon film 6 exerts little influence on the power generation efficiency.

While silicon nitride is used for the anti-reflection film 3 in this embodiment, silicon oxide may be used instead. In addition, in the photovoltaic cell according to this embodiment, surface defects present on the main surface of the n-type single-crystalline silicon substrate 1 are terminated with the i-type amorphous silicon film 2, so that the anti-reflection film 3 can be made of any material having good light transparency and capable of preventing the reflection of incident light, without consideration of the interface characteristics of the main surface. Note that silicon has a refractive index of about 3.4, and a sealing material such as EVA (ethylene-vinylacetate resin) which covers the photovoltaic cell at the time of its use has a refractive index of about 1.5; so that any material having a refractive index of 1.5 to 3.4 may be used as the anti-reflection film 3. Table 1 shows examples of such materials.

The p-type amorphous silicon film 7 in this embodiment is doped with B (boron) as impurities; however, a group III element such as Al (aluminum) or Ga (gallium), for example, may alternatively be doped as impurities. The n-type amorphous silicon film 6 is doped with P (phosphor) as impurities; however, a group V element such as As (arsenic), for example, may alternatively be doped as impurities. Moreover, an n-type polycrystalline silicon substrate may be used instead of the n-type single-crystalline substrate 1. The i-type amorphous silicon films 2, 4, the n-type amorphous silicon film 6, and the p-type amorphous silicon film 7 may each include microcrystalline silicon.

Further, instead of the n-type single-crystalline substrate 1, i-type amorphous silicon films 2, 4, n-type amorphous silicon film 6, and p-type amorphous silicon film 7 in this embodiment, other group VI elements such as SiC (silicon carbonate), SiGe (silicon germanium), and Ge (germanium) may be used.

In the photovoltaic cell according to this embodiment, the p-type amorphous silicon film 7 is formed on part of the i-type amorphous silicon film 4, and the n-type amorphous silicon film 6 is formed on the entire surfaces of the i-type amorphous silicon film 4 and the p-type amorphous silicon film 7; however, the n-type amorphous silicon film 6 may be formed on part of the i-type amorphous silicon film 4 with the p-type amorphous silicon film 7 being formed on the entire surfaces of the i-type amorphous silicon film 4 and the n-type amorphous silicon film 6.

In the photovoltaic cell according to this embodiment the n-type single crystalline silicon substrate 1 is used; however, any other types of substrates may also be used. For example, an i-type amorphous silicon film and a silicon nitride film may be formed on the main surface of a p-type single-crystalline silicon substrate, while the positive electrode 100 and the negative electrode 200 similar to those of the photovoltaic cell 500*i* according to this embodiment are provided on the back surface thereof.

(Eleventh Embodiment)

An eleventh embodiment of the present invention will hereinafter be described.

Figure 12:
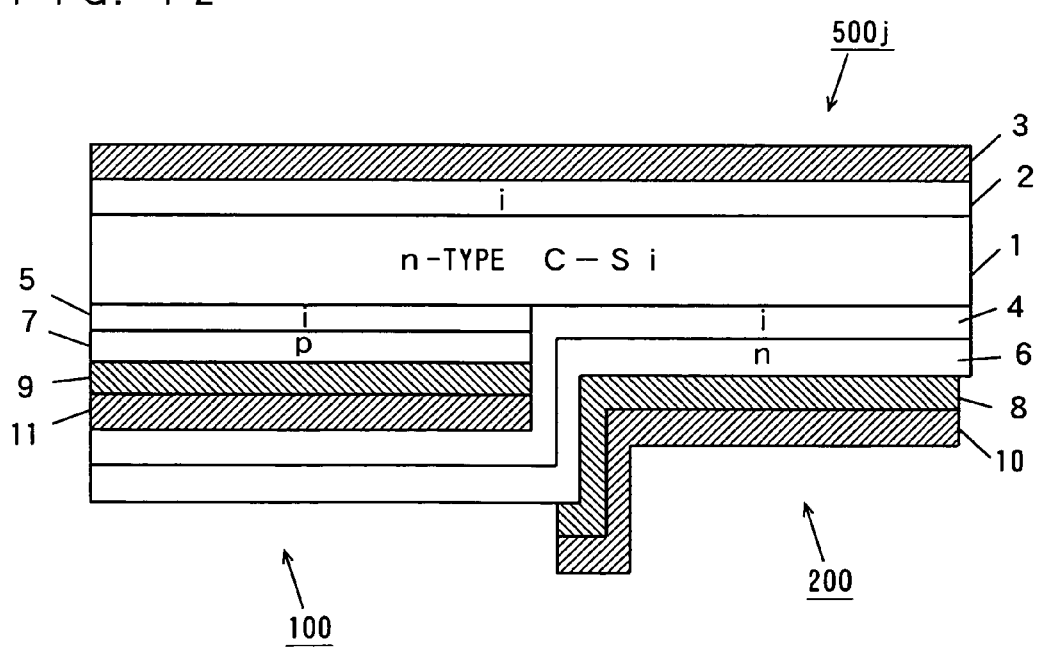
FIG. 12 is a schematic cross section showing the structure of a photovoltaic cell according to an eleventh embodiment.

FIG. 12 is a schematic cross section showing the structure of a photovoltaic cell 500*j* according to this embodiment. As shown in FIG. 12, its structure on the main surface of an n-type single-crystalline substrate 1 is similar to that of the photovoltaic cell 500*i* of FIG. 11.

An i-type amorphous silicon film 5, a p-type amorphous silicon film 7, a back electrode 9, and a collector electrode 11 are formed on part of the back surface of the n-type single-crystalline silicon substrate 1. An i-type amorphous silicon film 4 and an n-type amorphous silicon film 6 are formed in this order on the remaining region of the back surface of the n-type single-crystalline silicon substrate 1 and on the entire surface of the collector electrode 11. A back electrode 8 and a collector electrode 10 are formed in this order on the n-type amorphous silicon film 6 where the i-type amorphous silicon film 5 and the p-type amorphous silicon film 7 are not present.

The method of fabricating the photovoltaic cell of FIG. 12 is now described. Similarly to the fabrication method of the photovoltaic cell 500*i* of FIG. 11, an i-type amorphous silicon film 2 and an anti-reflection film 3 are formed in this order on the main surface of the n-type single-crystalline silicon substrate 1.

Then, part of the back surface of the n-type single-crystalline silicon substrate 1 is coated with a metal mask. SiH$_4$ gas and H$_2$ gas are subsequently introduced into the vacuum chamber, to form the i-type amorphous silicon film 5 by plasma CVD on the back surface of the n-type single-crystalline silicon substrate 1 except the part of the metal mask. Then, SiH$_4$ gas, H$_2$ gas, and B$_2$H$_6$ gas are introduced into the vacuum chamber to form the p-type amorphous silicon film 7 on the i-type amorphous silicon film 5 by plasma CVD, after which the back electrode 9 and the collector electrode 11 are formed on the p-type amorphous silicon film 7 by sputtering.

SiH$_4$ gas and H$_2$ gas are subsequently introduced into the vacuum chamber to form the i-type amorphous silicon film 4 on the collector electrode 11 and n-type single-crystalline silicon substrate 1 by plasma CVD. Then, SiH$_4$ gas, H$_2$ gas, and PH$_3$ (phosphine) gas are introduced into the vacuum chamber to form the n-type amorphous silicon film 6 on the i-type amorphous silicon film 4 by plasma CVD.

A metal mask is subsequently coated to cover the n-type amorphous silicon film 6 where the collector electrode 11 is present. Then, the back electrode 8 and the collector electrode 10 are formed by sputtering on the n-type amorphous silicon film 6 except the part of the metal mask.

In the photovoltaic cell according to this embodiment, it is not necessary to provide a conductive silicon film, a transparent electrode, and a collector electrode on the light-incident surface which may prevent effective use of incident light. This leads to a reduction in manufacturing steps and cost, as well as to the maximum use of incident light, so that the output voltage and fill factor can be maximized.

Moreover, since the i-type amorphous silicon film 4 and the n-type amorphous silicon film 6 are formed without the use of a metal mask, the steps of using metal masks can be reduced. As a result, manufacturing cost and time can be reduced.

Note that the thicknesses of the i-type amorphous silicon film 4 and n-type amorphous silicon film 6 are very small; hence, by jointing wiring or the like to the n-type amorphous silicon film 6 on the collector electrode 11, the collector electrode 11 and the wiring or the like can be electrically connected.

In the photovoltaic cell according to this embodiment, the i-type amorphous silicon film 5 and the p-type amorphous silicon film 7 are formed in this order on part of the back surface of the n-type single-crystalline silicon substrate 1, and the i-type amorphous silicon film 4 and the n-type amorphous silicon film 6 are formed in this order on the remaining region of the back surface of the n-type single-crystalline silicon substrate 1 and on the entire collector electrode 11; however, the i-type amorphous silicon film 5 and the n-type amorphous silicon film 6 may be formed on part of the back surface of the n-type single-crystalline silicon substrate 1, and the i-type amorphous silicon film 4 and the p-type amorphous silicon film 7 may be formed in this order on the remaining region of the back surface of n-type single-crystalline silicon substrate 1 and the entire collector electrode 11.

EXAMPLES

Inventive Example 1

In the Example below, a photovoltaic cell 500c having the structure of FIG. 5 was fabricated in the method of the above-described embodiment, for measurement of output characteristics. Table 2 shows conditions under which the photovoltaic cell of the Inventive Example was fabricated.

TABLE 2

| TREATMENT | | FORMATION CONDITIONS | | | | |
|---|---|---|---|---|---|---|
| | | SUBSTRATE TEMPERATURE (° C.) | USED GAS (sccm) | PRESSURE (Pa) | RF POWER DENSITY (mW/cm$^2$) | FILM THICKNESS (nm) |
| p-SIDE | i-TYPE AMORPHOUS SILICON FILM | 170 | $H_2$: 0~1000 $SiH_4$: 40 | 40 | 8.33 | 15 |
| | p-TYPE AMORPHOUS SILICON FILM | 170 | $H_2$: 0~1000 $SiH_4$: 40 $B_2H_6$ (2%): 40 | 40 | 8.33 | 10 |
| n-SIDE | i-TYPE AMORPHOUS SILICON FILM | 170 | $H_2$: 0~1000 $SiH_4$: 40 | 40 | 8.33 | 15 |
| | n-TYPE AMORPHOUS SILICON FILM | 170 | $H_2$: 0~1000 $SiH_4$: 40 $PH_3$ (1%): 40 | 40 | 8.33 | 15 |

As shown in Table 2, in the formation of a p-type amorphous silicon film 7, $B_2H_6$ gas diluted with $H_2$ gas was used with the concentration of $B_2H_6$ being set to 2% for $SiH_4$. In the formation of an n-type amorphous silicon film 6, on the other hand, $PH_3$ gas diluted with $H_2$ gas was used with the concentration of $PH_3$ set to 1% for $SiH_4$.

Comparative Example 1

Figure 13:
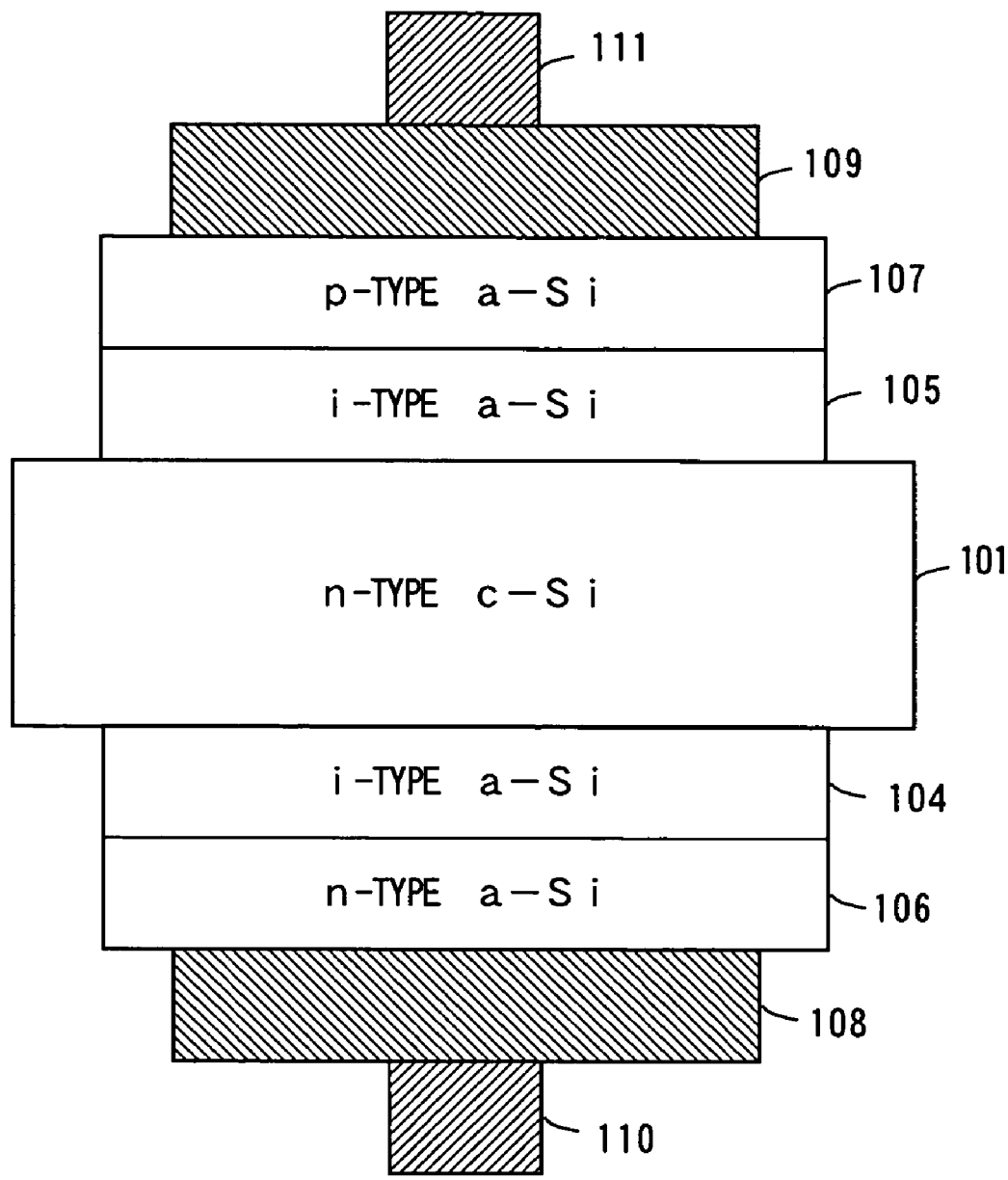
FIG. 13 is a schematic cross section showing the structure of a photovoltaic cell of Comparative Example.

FIG. 13 is a schematic cross section showing the structure of a photovoltaic cell of Comparative Example 1.

As shown in FIG. 13, an i-type amorphous silicon film 105 (non-doped amorphous silicon film) and a p-type amorphous silicon film 107 are formed in this order on a main surface (surface of the front side) of an n-type single-crystalline silicon substrate 101. A front electrode 109 made of ITO is formed on the p-type amorphous silicon film 107, and a comb-shaped collector electrode 111 made of Ag is formed on the front electrode 109.

On the back surface of the n-type single-crystalline silicon substrate 101 are formed an i-type amorphous silicon film 104 and an n-type amorphous silicon film 106 in this order. A back electrode 108 made of ITO is formed on the n-type amorphous silicon film 106, and a comb-shaped collector electrode 110 made of Ag is formed on the back electrode 108. In the photovoltaic cell of the Comparative Example 1, the n-type single-crystalline silicon substrate 1 serves as the primary power generating layer.

In the Comparative Example 1, the photovoltaic cell having the structure of FIG. 13 was fabricated for measurement of output characteristics. Each of the films in the photovoltaic cell of the Comparative Example 1 was fabricated under the same conditions as those of the Inventive Example 1.

(Evaluation)

The photovoltaic cells of the Inventive Example 1 and the Comparative Example 1 were measured for output characteristics. Table 3 shows output characteristics of the photovoltaic cells of the Inventive Example 1 and the Comparative Example 1.

TABLE 3

| | Pmax (W) | Voc (V) | Isc (A) | F.F. (%) |
|---|---|---|---|---|
| INVENTIVE EXAMPLE 1 | 2.14 | 0.706 | 3.94 | 76.8 |
| COMPARATIVE EXAMPLE 1 | 2.03 | 0.705 | 3.76 | 76.5 |

As shown in Table 3, the photovoltaic cell of the Inventive Example 1 showed high values for all of the maximum power Pmax, open-circuit voltage Voc, short-circuit current Isc, and fill factor F.F., compared with the photovoltaic cell of the Comparative Example 1.

It can be seen from the above that the photovoltaic cell of the Inventive Example 1 has higher output characteristics than the photovoltaic cell of the Comparative Example 1.

Inventive Examples 2, 3

In the Inventive Examples 2, 3 below, photovoltaic cells having the structures of FIG. 11 and FIG. 12, respectively, were fabricated in the methods of the above-described embodiments for measurement of output characteristics. Table 4 shows conditions under which the photovoltaic cells of the Inventive Examples 2, 3 were fabricated.

TABLE 4

| | TREATMENT | FORMATION CONDITIONS | | | | |
|---|---|---|---|---|---|---|
| | | SUBSTRATE TEMPERATURE (° C.) | USED GAS (sccm) | PRESSURE (Pa) | RF POWER DENSITY (mW/cm$^2$) | FILM THICKNESS (nm) |
| p-SIDE | i-TYPE AMORPHOUS SILICON FILM | 170 | $H_2$: 0~1000 $SiH_4$: 40 | 40 | 8.33 | 15 |
| | p-TYPE AMORPHOUS SILICON FILM | 170 | $H_2$: 0~1000 $SiH_4$: 40 $B_2H_6$ (2%): 40 | 40 | 8.33 | 10 |
| n-SIDE | i-TYPE AMORPHOUS SILICON FILM | 170 | $H_2$: 0~1000 $SiH_4$: 40 | 40 | 8.33 | 15 |
| | n-TYPE AMORPHOUS SILICON FILM | 170 | $H_2$: 0~1000 $SiH_4$: 40 $PH_3$ (1%): 40 | 40 | 8.33 | 15 |

As shown in Table 4, in the formation of each of the p-type amorphous silicon films 7, $B_2H_6$ gas diluted with $H_2$ gas was used with the concentration of $B_2H_6$ being set to 2% for $SiH_4$. In the formation of each of the n-type amorphous silicon films 6, $PH_3$ gas diluted with $H_2$ gas was used with the concentration of $PH_3$ set to 1% for $SiH_4$.

Comparative Example 2

In Comparative Example 2, a photovoltaic cell having the structure of FIG. 13 was fabricated for measurement of output characteristics. Each of the films in the photovoltaic cell of the Comparative Example 2 was fabricated in the same conditions as those of the Inventive Examples 2, 3.

(Evaluation)

The photovoltaic cells of the Inventive Examples 2, 3 and the Comparative Example 2 were measured for output characteristics. Table 5 shows output characteristics of the photovoltaic cells of the Inventive Examples 2, 3 and the Comparative Example 2.

TABLE 5

| | Pmax (W) | Voc (V) | Isc (A) | F.F. (%) |
|---|---|---|---|---|
| INVENTIVE EXAMPLE 2 | 2.09 | 0.704 | 3.90 | 76.3 |
| INVENTIVE EXAMPLE 3 | 2.14 | 0.706 | 3.94 | 76.8 |
| COMPARATIVE EXAMPLE 2 | 2.03 | 0.705 | 3.76 | 76.5 |

As shown in Table 5, the photovoltaic cell of the Inventive Example 2 showed somewhat small values for the open-circuit voltage Voc and fill factor F.F., compared with the photovoltaic cell of the Comparative Example 2, while showing high values for the maximum power Pmax and short-circuit current Isc.

As for the photovoltaic cell of the Inventive Example 3, it showed high values for all of the maximum power Pmax, open-circuit voltage Voc, short-circuit current Isc, and fill factor F.F., compared with the photovoltaic cell of the Comparative Example 2.

It can be seen from the above that the photovoltaic cells of the Inventive Examples 2, 3 has higher output characteristics than the photovoltaic cell of the Comparative Example 2.

INDUSTRIAL AVAILABILITY

As discussed above, the photovoltaic cell according to the present invention is capable of making the maximum use of incident light. In the method of fabricating a photovoltaic cell according to the present invention, the above-described photovoltaic cell can be fabricated. Hence, the photovoltaic cell according to the present invention is suitable for use as a photovoltaic cell using a semiconductor junction, and the method of fabricating a photovoltaic cell according to the present invention is suitable for use in fabricating a photovoltaic cell using a semiconductor junction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic cell comprising:
   a crystal-based semiconductor having one face and another face;
   an intrinsic first amorphous-based semiconductor film;
   a second amorphous-based semiconductor film including impurities showing one conductivity-type;
   a first electrode;
   a semiconductor layer including impurities showing another conductivity-type different from said one conductivity-type; and
   a second electrode, wherein
   said first amorphous-based semiconductor film, said second amorphous-based semiconductor film, and said first electrode are formed in this order on a first region of said one face of said crystal-based semiconductor, and
   said semiconductor layer and said second electrode are formed in this order on a second region of said one face of said crystal-based semiconductor.

2. The photovoltaic cell according to claim 1, wherein said crystal-based semiconductor includes impurities showing said one conductivity-type.

3. The photovoltaic cell according to claim 1, wherein said semiconductor layer is a third amorphous-based semiconductor film including impurities showing said another conductivity-type, the photovoltaic cell further comprising an intrinsic fourth amorphous-based semiconductor film provided between said crystal-based semiconductor and said third amorphous-based semiconductor film.

4. The photovoltaic cell according to claim 3, wherein said first amorphous-based semiconductor film on said first region of said crystal-based semiconductor and said fourth amorphous-based semiconductor film on said second region are a continuous common amorphous-based semiconductor film.

5. The photovoltaic cell according to claim 4, wherein said second amorphous-based semiconductor film and said third amorphous-based semiconductor film are provided at a distance from each other, the photovoltaic cell further comprising a protective layer provided on a surface of said common amorphous-based semiconductor film between said second amorphous-based semiconductor film and said third amorphous-based semiconductor film.

6. The photovoltaic cell according to claim 3, wherein said first amorphous-based semiconductor film on said first region of said crystal-based semiconductor and said fourth amorphous-based semiconductor film on said second region are formed in contact with each other.

7. The photovoltaic cell according to claim 6, wherein said second amorphous-based semiconductor film and said third amorphous-based semiconductor film are formed in contact with each other.

8. The photovoltaic cell according to claim 1, wherein said first region and said second region are provided at a distance from each other, the photovoltaic cell further comprising a protective layer provided on a surface of said crystal-based semiconductor between said first region and said second region.

9. The photovoltaic cell according to claim 1, wherein said semiconductor layer is a doped layer in which said second region of said crystal-based semiconductor is doped with impurities showing said another conductivity-type.

10. The photovoltaic cell according to claim 1, wherein said second amorphous-based semiconductor film is a doped layer in which said first amorphous-based semiconductor film is doped with impurities showing said another conductivity-type.

11. The photovoltaic cell according to claim 1, wherein substantially the whole of said another face is a light-incident surface.

12. The photovoltaic cell according to claim 1, further comprising an anti-reflection film provided on the another face of said crystal-based semiconductor.

13. The photovoltaic cell according to claim 12, further comprising an intrinsic fifth amorphous-based semiconductor film provided between said another face of said crystal-based semiconductor and said anti-reflection film.

* * * * *